United States Patent [19]

Ogi et al.

[11] Patent Number: 5,453,294

[45] Date of Patent: Sep. 26, 1995

[54] METHOD OF CONTROLLING CRYSTAL ORIENTATION OF PZT AND PLZT THIN FILMS ON PLATINUM SUBSTRATES

[75] Inventors: Katsumi Ogi; Nobuyuki Soyama; Akihiko Mieda, all of Omiya, Japan

[73] Assignee: Mitsubishi Materials Corporation, Japan

[21] Appl. No.: 49,634

[22] Filed: Apr. 16, 1993

Related U.S. Application Data

[63] Continuation of Ser. No. 833,982, Feb. 11, 1992, abandoned.

[30] Foreign Application Priority Data

Feb. 13, 1991 [JP] Japan .................... 3-040592

[51] Int. Cl.[6] .................... B05D 5/12; C04B 35/46
[52] U.S. Cl. .................... 427/100; 427/126.3; 427/240; 427/376.4; 427/380; 501/134; 501/135; 501/136; 501/137; 501/152
[58] Field of Search .................... 427/100, 126.3, 427/376.4, 79, 240, 380; 501/134, 135, 136, 137, 152

[56] References Cited

U.S. PATENT DOCUMENTS

| | | | |
|---|---|---|---|
| 4,963,390 | 10/1990 | Lipeles et al. .................... | 427/100 |
| 5,028,455 | 7/1991 | Miller et al. .................... | 427/100 |

FOREIGN PATENT DOCUMENTS

| | | | |
|---|---|---|---|
| 0338799 | 10/1989 | European Pat. Off. ........ | C01G/25/00 |
| 9012755 | 11/1990 | WIPO .................... | C01G/25/00 |
| 9013149 | 11/1990 | WIPO .................... | H01L/41/24 |

OTHER PUBLICATIONS

Patent Abstracts of Japan, Ueda Ichiro; others, "Ferroelectric Thin–Film And Manufacture Thereof", Publication No. JP4005874, Date Jan. 9, 1992, Abstract Publ Date Apr. 21, 1992 vol. 016150.

B. M. Melnick et al., "Process Optimization and Characterization of Device Worthy Sol–Gel Based PZT for Ferroelectric Memories", Ferroelectrics, 1990, vol. 112, pp. 329–351.

Yi et al, J. Appl. Phys. 64 2717 (1988).

*Primary Examiner*—Benjamin L. Utech
*Attorney, Agent, or Firm*—Webb Ziesenheim Bruening Logsdon Orkin & Hanson

[57] ABSTRACT

In the production of ferroelectric PZT or PLZT thin film by the sol-gel method, application of precursor solution (sol) onto a substrate is followed by heat-treatment for pyrolysis at 150°–250° C., 250°–359° C., or 450°–550° C., and further firing for crystallization at 500°–800° C., whereby crystal orientation in the direction of the (111) plane, or the (111) and (100) planes, or the (100) and (200) planes can be effected.

3 Claims, 4 Drawing Sheets

METHOD OF CONTROLLING CRYSTAL ORIENTATION OF PZT AND PLZT THIN FILMS ON PLATINUM SUBSTRATES

This is a continuation of application 07/833,982 filed on Feb. 11, 1992, now abandoned.

FIELD OF THE INVENTION

The present invention relates to a method for controlling the crystal orientation of ferroelectric thin film of lead zirconate titanate (PZT) or lanthanum-containing lead zirconate titanate (PLZT). PZT thin film or PLZT thin film is used as infrared sensor, piezoelectric filter, vibrator, laser modulating element, optical shutter, capacitor film, nonvolatile memory, etc. It has outstanding physical properties with which it can be formed in a sharp, fine pattern on a substrate.

BACKGROUND OF THE INVENTION

There are known three methods for forming ferroelectric PZT or PLZT thin film on a substrate. (a) The first one comprises application of a paste of powdery compound oxide onto a substrate, followed by drying and baking. (b) The second one is sputtering. (c) The third one is the so-called sol-gel method which consists of application of a compound precursor compound (such as metal alkoxide in the form of sol) onto a substrate and subsequent heat treatment to bring about crystallization.

Usefulness of ferroelectric thin film is derived from its polarization reversibility. However, polarization reversibility causes crystal strains, which result in fatigue of film. A conceivable countermeasure against crystal strains is to form the thin film in such a way as to grow a single crystal or to orient crystals in the direction of polarization axis. Although there are a lot of reports about the crystal orientation in thin film, most of them are about PZT thin film formed by sputtering and there are few reports about crystal orientation involved in the formation of thin film by the sol-gel method. The sol-gel method is now attracting attention because of its ability to yield good thin film at low temperatures easily and economically.

It is well known that the crystal orientation in the thin film formed by the sol-gel method depends on and usually coincides with the crystal axis of the substrate. However, there are instances where the direction of crystal orientation differs from the crystal axis of the substrate. This makes it difficult to reliably control the crystal orientation of the thin film.

SUMMARY OF THE INVENTION

The present inventors found that PZT thin film or PLZT thin film formed by the sol-gel method differs in its crystal orientation depending on the temperature of heating of the starting material (precursor) solution (sol) applied onto the substrate. This finding led to the present invention. Accordingly, it is an object of the present invention to provide a method for reliably control the crystal orientation of PZT thin film or PLZT thin film by adjusting the temperature of heat treatment for the precursor solution applied onto the substrate.

To be more specific, it is an object of the present invention to provide a method for controlling the crystal orientation of ferroelectric thin film in which a ferroelectric thin film is formed by application of a precursor solution of lead zirconate titanate or lanthanum-containing lead zirconate titanate onto a platinum substrate with its crystal orientation in the direction of the (111) axis and heating, wherein the precursor solution applied onto the substrate is heat-treated at a temperature in the range of 150°–550° C. for pyrolysis in accordance with the desired crystal orientation and subsequently at 550°–880° C. for firing for crystallization, thereby preferential crystal orientation of the thin film is caused in the direction of the specific axis which is determined by the heat treatment temperature.

It is another object of the present invention to provide a method for controlling the crystal orientation of ferroelectric thin film, wherein the application of precursor solution onto the substrate is followed by heat treatment at 150°–250° C. for pyrolysis and subsequently by firing which causes the thin film to crystallize, with preferential crystal orientation in the (111) plane.

It is still another object of the present invention to provide a method for controlling the crystal orientation of ferroelectric thin film, wherein the application of a precursor solution onto the substrate is followed by heat treatment at 250°–350° C. for pyrolysis and subsequent firing which causes the thin film to crystallize, with preferential crystal orientation in the direction of the (111) plane and (100) plane.

The starting materials used in the present invention are organic acid salts, alkoxides, β-diketone complexes, etc., which are well known in this technical field. They can be used equivalently.

DETAILED DESCRIPTION OF THE INVENTION

Figure 1A:
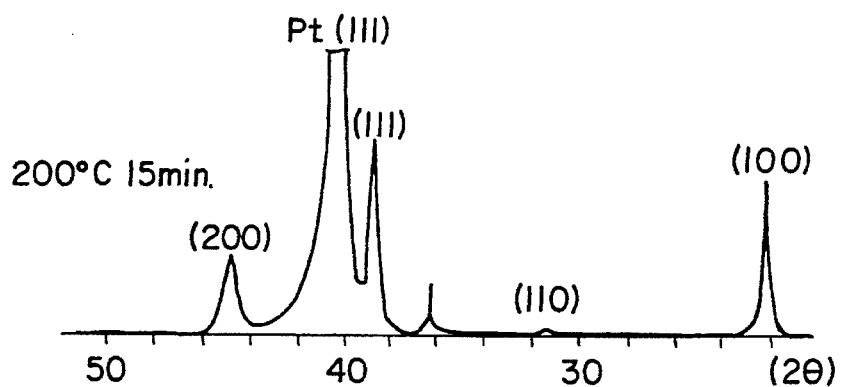
FIGS. 1, 2, 3, and 4 are X-ray diffraction patterns obtained with PZT thin films and the PLZT thin films in accordance with the present invention.

According to the present invention, PZT thin film or PLZT thin film is formed on a platinum substrate with its crystal orientation in the [111] axis. The substrate should be electrically conductive so that it can be used as the bottom side electrode; in addition, it should not react with PZT thin film or PLZT thin film. Because of these requirements, platinum is a very desirable material. The platinum substrate may be in the form of plate or thin film formed on another substrate. Incidentally, a platinum film formed on a thermally oxidized silicon wafer is oriented in the [111] axis.

The method of the present invention consists of applying a precursor solution of PZT thin film or PLZT thin film, which is a sol of compound organometallic compound as a precursor, onto a platinum substrate oriented in the [111] direction, heat-treating the thus formed film at 150°–550° C. for pyrolysis, and subsequently firing at 600°–800° C. for crystallization. The temperature for the first heat treatment (prior to crystallization) should be properly adjusted within a range of from 150° C. to 550° C. so as to control the crystal orientation of the PZT thin film or PLZT thin film.

To be more specific, with a heat treatment temperature adjusted within a range of from 150° C. to 259° C., it is possible to obtain a PZT thin film or PLZT thin film composed of crystals of perovskite structure preferentially oriented in the (111) plane. Heat treatment at below 150° C. is insufficient for the heat treatment. Heat treatment at above 250° C. causes orientation in the (100) plane in preference to the (111) plane.

With the heat treatment temperature adjusted within a range of from 250° C. to 350° C., it is possible to obtain a PZT thin film or PLZT thin film composed of crystals of perovskite structure preferentially oriented in the (111) plane and (100) plane. Heat treatment at below 250° C. causes orientation in the (111) plane preferentially. Heat treatment at from above 350° C. up to 450° C. does not cause preferential orientation in the (111) plane and (100) plane.

At the heat treatment temperature adjusted within a range of from 450° C. to 550° C., it is possible to obtain a PZT thin film or PLZT thin film composed of crystals preferentially oriented in the (100) plane and (200) plane. Heat treatment at below 450° C. causes preferential orientation in the crystal planes other than the (111) plane. Heat treatment at above 550° C. causes premature crystallization.

The firing for crystallization should be carried out within a range of from 550° C. to 800° C. Heat treatment at above 800° C. causes PZT thin film to react with platinum, resulting in deteriorated physical properties.

The following table shows the relation between the heat treatment temperature and the crystal plane in which crystals orient preferentially.

| Heat treatment temperature | Preferential orientation |
| --- | --- |
| 150–250° C. | (111) |
| 250–350° C. | (111) and (100) |
| 450–550° C. | (100) and (200) |

EXAMPLE 1

Figure 1B:
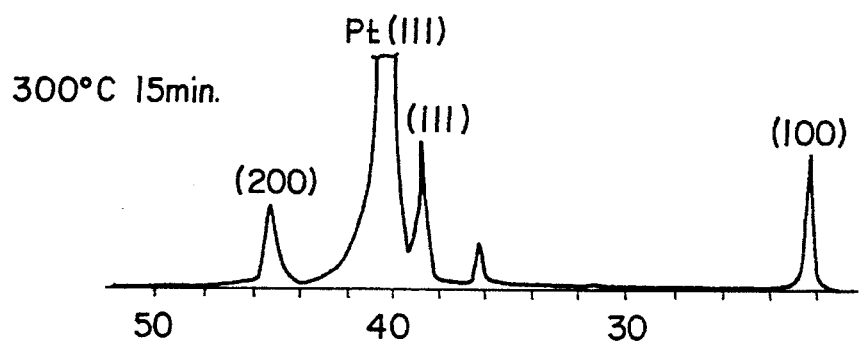
Figure 1C:
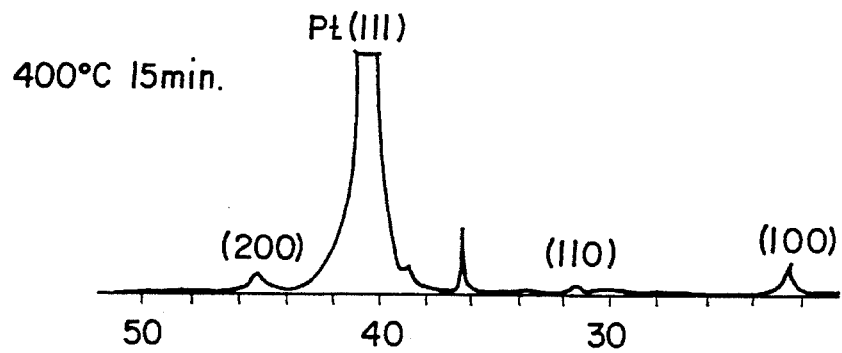
Figure 1D:
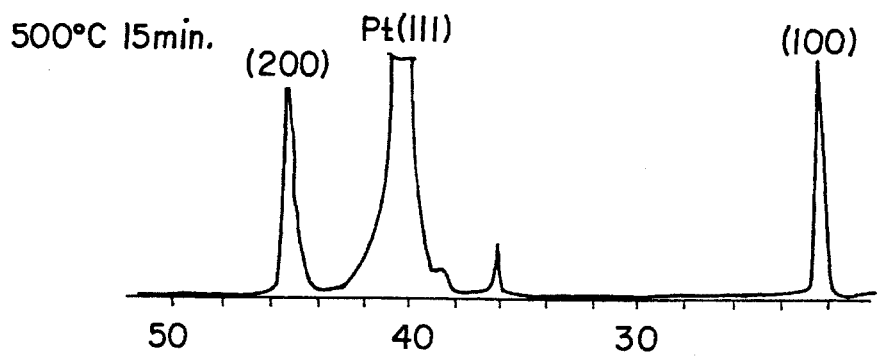
Figure 2A:
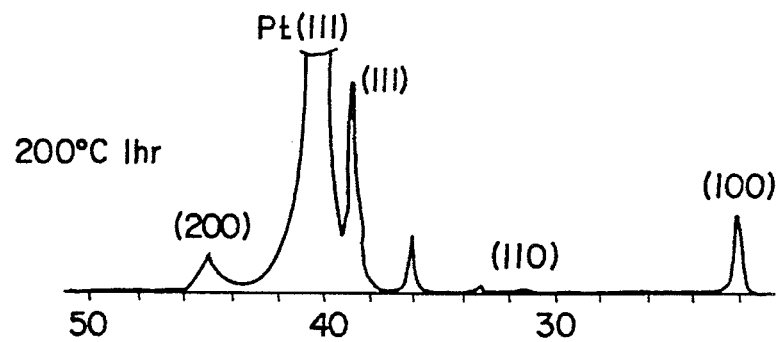
Figure 2B:
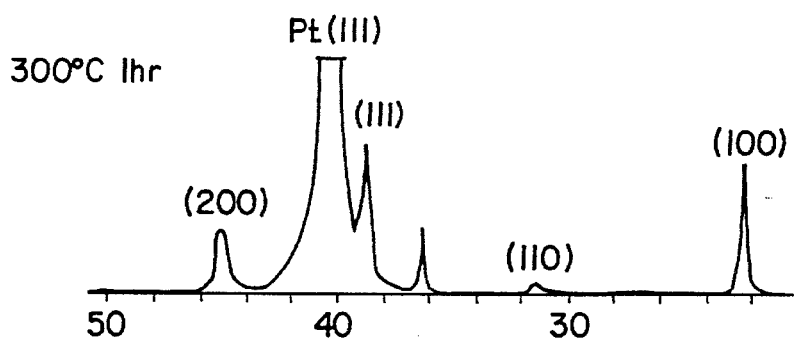
Figure 2C:
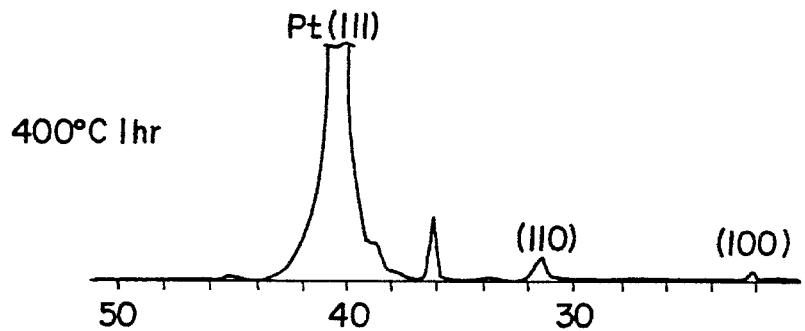
Figure 2D:
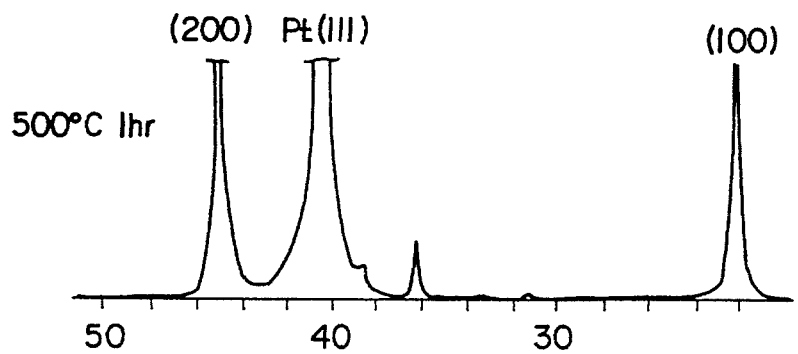
Figure 3A:
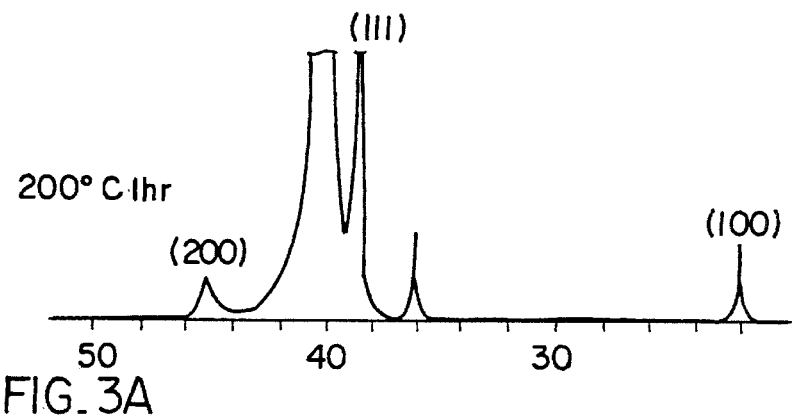
Figure 3B:
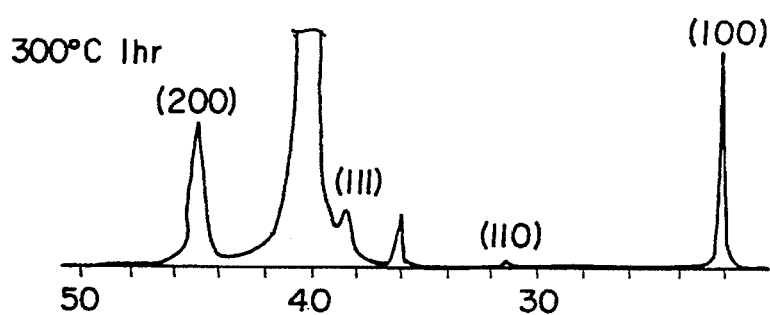
Figure 3C:
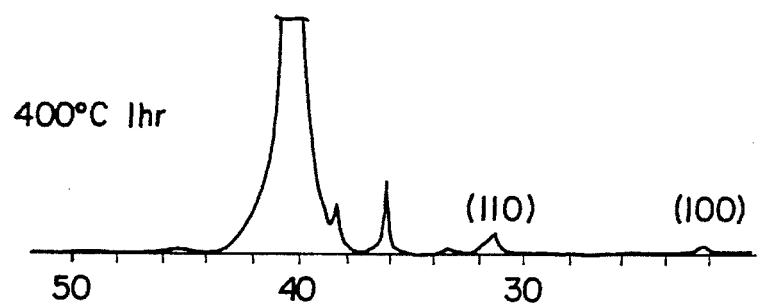
Figure 3D:
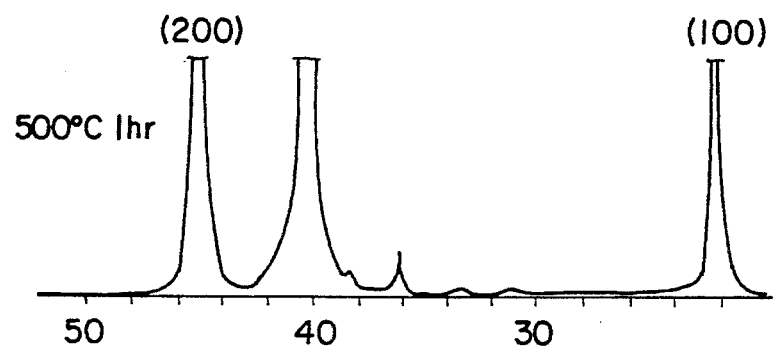
Figure 4A:
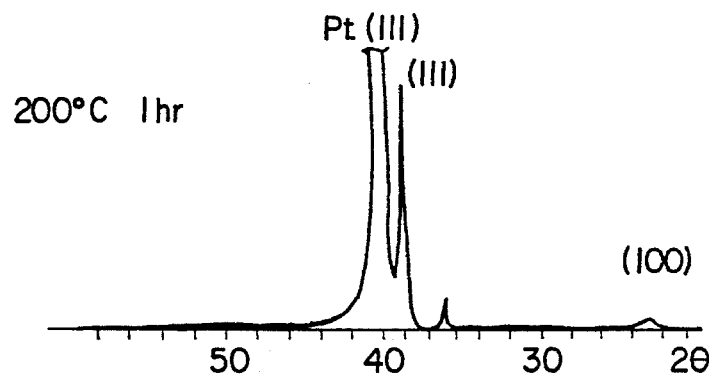
Figure 4B:
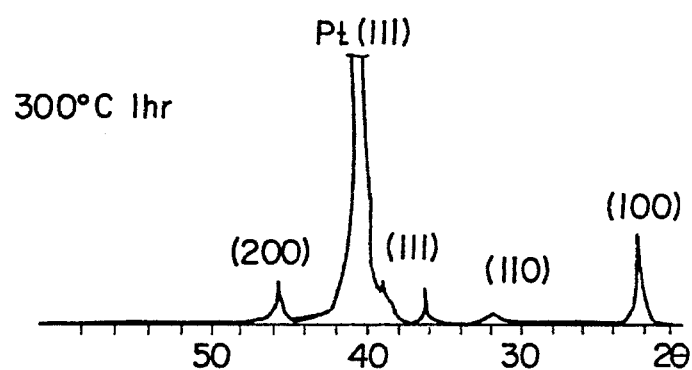
Figure 4C:
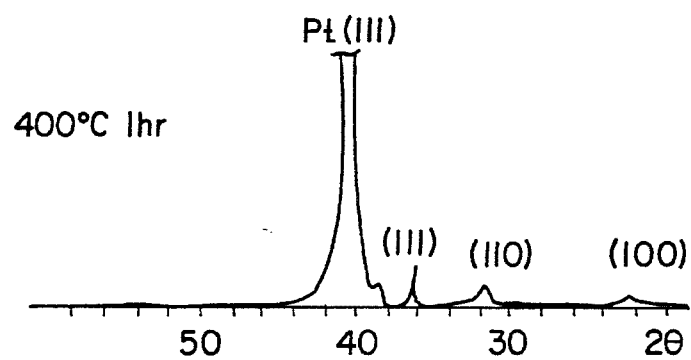
Figure 4D:
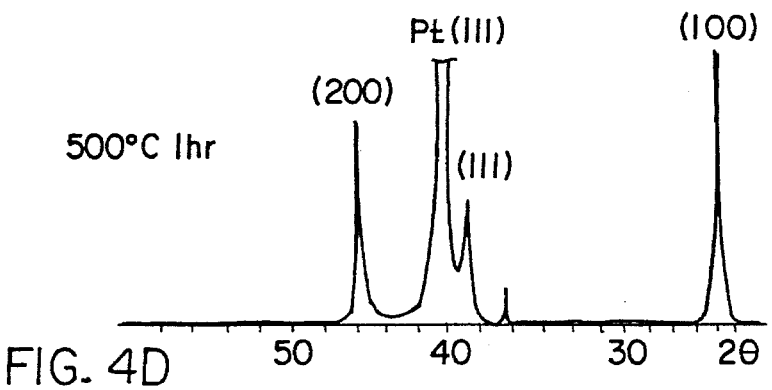

In 55 g of ethoxyethanol, 7.59 g $Pb(CH_3COO)_2 \cdot 3H_2O$, 3.99 g $Zr(OBu)_4$ and 2.73 g $Ti(OrPr)_4$ were dissolved. The thus obtained precursor solution (sol) was applied to platinum plates, the crystals of which oriented in the (111) axis by means of a spin coater. The coated plates were heat-treated at 200° C., 300° C., 400° C., and 500° C. for 15 minutes respectively. The heat treatment was followed by firing for crystallization at 600° C. for 1 hour. Thus there were obtained four samples of PZT ($PbZr_{0.52}Ti_{0.48}O_3$) thin film. They gave X-ray diffraction patterns as shown in FIG. 1 (A: 200° C. B: 300° C., C: 400° C., D: 500° C.). FIG. 1A indicates that the PZT thin film has preferential crystal orientation in the (111) plane. FIG. 1B indicates that the PZT thin film has preferential crystal orientation in the (111) plane and (100) plane. FIG. 1C indicates that the PZT thin film has no preferential crystal orientation in particular planes. FIG. 1D indicates that the PZT thin film has preferential crystal orientation in the (100) plane and (200) plane. With respect to the result shown in FIG. 1A, it is considered that a longer firing will bring about prefential orientation in the (111) axis.

EXAMPLE 2

The same procedure as in Example 1 was repeated except that the heat treatment was carried out for 1 hour. The resulting samples of PZT thin film gave X-ray diffraction patterns as shown in FIG. 2 (A: 200° C., B: 300° C., C: 400° C., D: 500° C.). This result is similar to that in Example 1.

EXAMPLE 3

The same procedure as in Example 2 was repeated except that the precursor solution was reflexed for 10 hours before use. The resulting samples of PZT thin film gave X-ray diffraction patterns as shown in FIG. 3.

EXAMPLE 4

The procedures of Example 1 were repeated using 7.2 g of $Pb(CH_3COO)_2 \cdot 3H_2O$, 3.94 g of $Zr(OBu)_4$, 0.34 g of $La(CH_3COO)_3 \cdot 1.5H_2O$ 2.70 g of $Ti(OiPr)$ and 55 g 2-ethoxyethanol. The resulting PLZT was $Pb_{0.95}La_{0.05}Zr_{0.51}Ti_{0.47}O_3$. The X-ray diffraction patterns are shown in FIG. 4 (A: 200° C., B: 300° C., C: 400° C. and D: 500° C.). Generally, they show characters similar to FIG. 1–3, but preferentiality is improved.

What is claimed is:

1. A method for forming a ferroelectric thin film having a preferential crystal orientation comprising the steps of:

providing a platinum substrate;

applying a film of an organic metal compound precursor solution for forming one of the group consisting of lead zirconate titanate and lanthanum-containing lead zirconate titanate onto the surface of the platinum substrate;

pyrolyzing said applied film at a temperature of at least 150° C. and at most 250° C. for at least about 15 minutes; and subsequent heating of said platinum substrate and applied film in the range of 550°–800° C. to crystallize the film, whereby the film is composed of crystals preferentially oriented in a direction of a (111) plane.

2. A method for forming a ferroelectric thin film having a preferential crystal orientation comprising the steps of:

providing a platinum substrate;

applying a film of an organic metal compound precursor solution for forming one of the group consisting of lead zirconate titanate and lanthanum-containing lead zirconate titanate onto the surface of the platinum substrate;

pyrolyzing said applied film at a temperature of greater than 250° C. and up to a temperature of 350° C. for at least about 15 minutes; and subsequent heating of said platinum substrate and applied film in the range of 550°–800° C. to crystallize the film, whereby the film is composed of crystals preferentially oriented in a direction of a (111) plane and a (100) plane.

3. A method for forming a ferroelectric thin film having a preferential crystal orientation comprising the steps of:

providing a platinum substrate;

applying a film of an organic metal compound precursor solution for forming one of the group consisting of lead zirconate titanate and lanthanum-containing lead zirconate titanate onto the surface of the platinum substrate;

pyrolyzing said applied film at a temperature of at least 450° C. and at most 550° C. for at least about 15 minutes; and subsequent heating of said platinum substrate and applied film in the range of 550°–800° C. to crystallize the film, whereby the film is composed of crystals preferentially oriented in a direction of a (100) plane and a (200) plane.

* * * * *

UNITED STATES PATENT AND TRADEMARK OFFICE
CERTIFICATE OF CORRECTION

PATENT NO. : 5,453,294
DATED : September 26, 1995
INVENTOR(S) : Katsumi Ogi, Nobuyuki Soyama and Akihiko Mieda It is certified that error appears in the above-indentified patent and that said Letters Patent is hereby corrected as shown below:

Abstract Line 4 "359° C.," should read --350° C.,--.

Column 1 Line 23 "compoud" should read --compound--.

Column 1 Line 60 "control" should read --controlling--.

Column 2 Line 61 "259° C.," should read --250° C.,--.

Column 3 Line 34 "Pb(CH$_3$COO)$_2$.3H$_2$O," should read --Pb(CH$_3$COO)$_2$•3H$_2$O,--.

Column 3 Line 53 "prefential" should read --preferential--.

Column 4 Line 4 "Pb(CH$_3$COO)$_2$.3H$_2$O," should read --Pb(CH$_3$COO)$_2$•3H$_2$O,--.

Column 4 Line 5 "La(CH$_3$COO)$_3$.1.5H$_2$O" should read --La(CH$_3$COO)$_3$•1.5H$_2$O,--.

Column 4 Line 5 after "55 g" insert --of--.

Column 4 Line 9 "FIG." should read --FIGS.--.

Signed and Sealed this

Fifth Day of March, 1996

Attest:

BRUCE LEHMAN

Attesting Officer       Commissioner of Patents and Trademarks